United States Patent
Gorecki et al.

(10) Patent No.: US 9,647,643 B2
(45) Date of Patent: *May 9, 2017

(54) LOW POWER BUFFER WITH GAIN BOOST

(71) Applicant: INPHI CORPORATION, Santa Clara, CA (US)

(72) Inventors: James Lawrence Gorecki, Santa Clara, CA (US); Han-Yuan Tan, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,449

(22) Filed: Aug. 8, 2016

(65) Prior Publication Data

US 2016/0352372 A1   Dec. 1, 2016

Related U.S. Application Data

(63) Continuation of application No. 14/614,257, filed on Feb. 4, 2015, now Pat. No. 9,432,000.

(51) Int. Cl.
   *H03K 3/012*       (2006.01)
   *H03K 5/02*        (2006.01)
   (Continued)

(52) U.S. Cl.
   CPC .......... *H03K 3/012* (2013.01); *G11C 27/026* (2013.01); *H03F 1/3205* (2013.01);
   (Continued)

(58) Field of Classification Search
   CPC .......... H03K 3/012; H03K 5/02; H03K 5/023; H03M 1/124
   (Continued)

(56) References Cited

U.S. PATENT DOCUMENTS 5,977,796 A * 11/1999 Gabara ............ H03K 19/00384
                                                      326/119
6,417,708 B1 * 7/2002 Fiedler ................. H03K 17/163
                                                      327/170
(Continued)

OTHER PUBLICATIONS

Cheng-Chung Hus et al., "An 11 b 800MS/s Time-Interleaved ADC wth Digital Background Calibration", Proceedings of the 2007 International Solid State Circuit Conference, Feb. 14, 2007, pp. 464-465, 615.

(Continued)

*Primary Examiner* — William Hernandez
(74) *Attorney, Agent, or Firm* — Richard T. Ogawa; Ogawa P.C.

(57) ABSTRACT

The present disclosure provides a detailed description of techniques for implementing a low power buffer with gain boost. More specifically, some embodiments of the present disclosure are directed to a buffer with a stacked transistor configuration, wherein the first transistor receives an input signal and the second transistor receives a complement of the input signal. The first transistor is configured to generate a non-inverting response to the input signal, and the second transistor is configured to generate an inverting response to the complement of the input signal, and to generate a negative $g_{ds}$ effect, enabling the buffer to exhibit low power and unity gain across a wide bandwidth. In other embodiments, the stacked transistor configuration can be deployed in a full differential implementation. In other embodiments, the buffer can include techniques for improving linearity, DC level shifts, capacitive input loading, and output slewing, settling, and drive capabilities.

15 Claims, 11 Drawing Sheets

(51) Int. Cl.
*G11C 27/02* (2006.01)
*H03F 1/32* (2006.01)
*H03F 3/45* (2006.01)
*H03M 1/12* (2006.01)
*H03M 3/00* (2006.01)

(52) U.S. Cl.
CPC ....... *H03F 1/3211* (2013.01); *H03F 3/45183* (2013.01); *H03F 3/45475* (2013.01); *H03K 5/023* (2013.01); *H03M 1/124* (2013.01); *H03M 1/1215* (2013.01); *H03M 3/38* (2013.01)

(58) Field of Classification Search
USPC ...... 326/62, 82, 83; 327/108, 109, 110, 111, 327/112, 306, 307, 331, 332, 333
See application file for complete search history.

(56) References Cited

U.S. PATENT DOCUMENTS 8,638,130 B1 * 1/2014 Olsen .................. G11C 7/1057
327/108

2010/0060320 A1 * 3/2010 Lee ...................... G11C 7/1051
326/80

2016/0240230 A1 * 8/2016 Lee ................ H03K 19/018585

OTHER PUBLICATIONS

Sandeep Gupta et al., "A 1GS/s 11 b Time-Interleaved ADC in 0.13μm CMOS", Proceedings of the 2006 International Solid State Circuit Conference, Feb. 8, 2006, Session 31-6.

Shahriar Shahramian et al., "A 30-GS/s Track and Hold Amplifier in 0.13-μm CMOS Technology", IEEE 2006 Custom Integrated Circuits Conference, 2006, pp. 493-496.

Simon Louwsma et al., "A Time-Interleaved Track & Hold in 0.13μm CMOS sub-sampling a 4 GHz Signal with 43dB SNDR", IEEE 2007 Custom Integrated Circuits Conference, 2007, pp. 329-332.

Francesco Centurelli et al., "Design Solutions for Sample-and-Hold Circuits in CMOS Nanometer Technologies", IEEE Transactions of Circuits and Systrems-II: Express Briefs, 2009, pp. 459-463, vol. 56, No. 6.

Tang Kai et al., "A 20GSps Track-and-Hold Circuit in 90nm CMOS Technology", 2012 International Conference on Advanced Technologies for Communications, 2012, pp. 237-240.

* cited by examiner

LOW POWER BUFFER WITH GAIN BOOST

RELATED APPLICATIONS

The present application is a continuation of U.S. patent application Ser. No. 14/614,257, filed on Feb. 4, 2015, which is related to co-pending U.S. patent application Ser. No. 14/614,253, entitled "LOW POWER BUFFER WITH DYNAMIC GAIN CONTROL", filed on Feb. 4, 2015, which is hereby incorporated by reference in its entirety.

FIELD

This disclosure relates to the field of buffers for high resolution ADCs and more particularly to techniques for implementing a low power buffer with gain boost.

BACKGROUND

High resolution, high speed analog-to-digital converters (ADCs) can require buffers to isolate a high impedance track-and-hold (TAH) stage from one or more sample-and-hold (SAH) stages preceding the ADC. In some cases, buffers can be used to isolate successive SAH stages. Such buffer implementations can be a key component in enabling and advancing high speed communication (e.g., 100 Gigabit Ethernet) networks and systems. For example, a 28 Gbps serial link communication receiver might require multiple successive approximation register (SAR) ADCs, each with one or more buffers exhibiting at least the following characteristics: wide bandwidth, very fast large signal settling and slewing (e.g., low output impedance), high linearity over the full analog input signal, low noise, high power supply rejection, and high input impedance over the wide bandwidth (e.g., near or in excess of the Nyquist rate). Such receivers might also demand the buffer exhibit low power consumption, which introduces further demands that the buffer gain to be near unity. For example, a unity gain buffer might enable the buffer and the ADC to be powered by a common low supply voltage (e.g., 1V), providing both low power consumption by the buffer, and full use of the available ADC dynamic range.

Legacy buffer designs can exhibit some of the aforementioned characteristics, but fall short of achieving all of the aforementioned required buffer performance characteristics. For example, a legacy source-follower buffer can have high bandwidth, but only moderate linearity and overall signal settling. The source-follower buffer can also exhibit asymmetric positive and negative slewing. Other legacy buffer designs might address one or more performance issues (e.g., asymmetric slewing or linearity), but do not achieve all the aforementioned buffer characteristics required for advancing low power, high speed communication system implementations. Further, the legacy buffer designs exhibit DC level shifts and gains less than unity (e.g., 0.7-0.8), further decreasing linearity and increasing power consumption. For example, to provide a signal to an ADC operating at 1V such that the full ADC dynamic range is utilized, a legacy buffer design with a gain of 0.7 might require a supply voltage of 1.4V, increasing the power consumption as compared to a buffer with unity gain and operating at a lower supply voltage.

Techniques are needed to address the problem of implementing a low power buffer that exhibits unity gain across a wide bandwidth. None of the aforementioned legacy approaches achieve the capabilities of the herein-disclosed techniques for a low power buffer with gain boost. Therefore, there is a need for improvements.

SUMMARY

The present disclosure provides improved techniques to address the aforementioned issues with legacy approaches. More specifically, the present disclosure provides a detailed description of techniques for implementing a low power buffer with gain boost. The claimed embodiments address the problem of implementing a low power buffer that exhibits unity gain across a wide bandwidth. More specifically, some claims are directed to approaches for providing gain boosting using a stacked transistor configuration to generate a negative drain transconductance (e.g., $g_{ds}$) effect, which claims advance the technical fields for addressing the problem of implementing a low power buffer that exhibits unity gain across a wide bandwidth, as well as advancing peripheral technical fields. Some claims improve the functioning of multiple systems within the disclosed environments.

Some embodiments of the present disclosure are directed to a buffer with a stacked transistor configuration, where the first transistor receives an input signal and the second transistor receives a complement of the input signal. The first transistor is configured to generate a non-inverting response to the input signal, and the second transistor is configured to generate an inverting response to the complement of the input signal, and to generate a negative $g_{ds}$ effect, enabling the buffer to exhibit low power and unity gain across a wide bandwidth. In other embodiments, the stacked transistor configuration can be deployed in a full differential implementation. In other embodiments, the buffer can include techniques for improving linearity, DC level shifts, capacitive input loading, and output slewing, settling, and drive capabilities.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings described below are for illustration purposes only. The drawings are not intended to limit the scope of the present disclosure.

DETAILED DESCRIPTION

Figure 1:
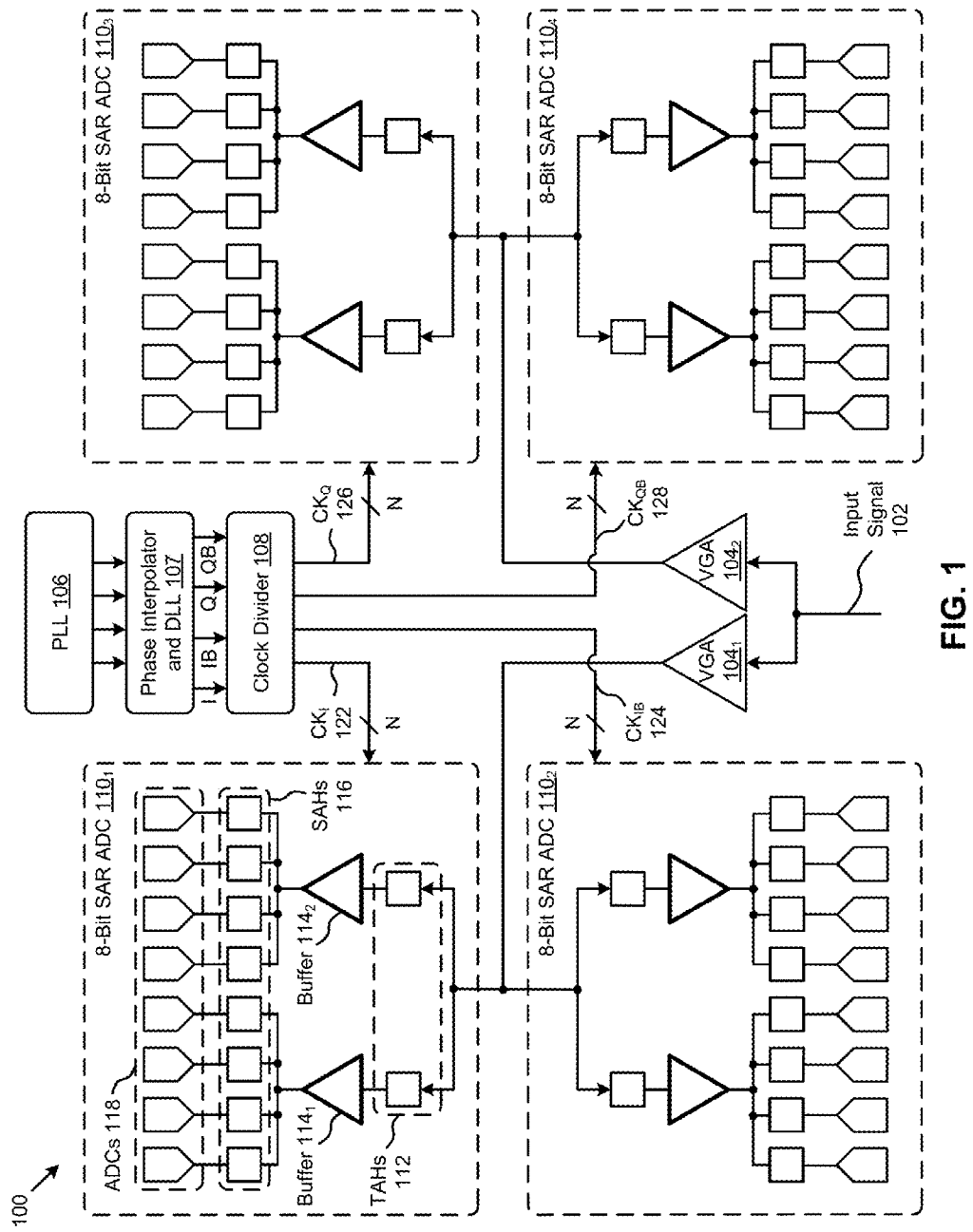
FIG. 1 presents a high speed serial link receiver system in an environment that includes buffers.

Some embodiments of the present disclosure address the problem of implementing a low power buffer that exhibits unity gain across a wide bandwidth and some embodiments are directed to approaches for providing gain boosting using a stacked transistor configuration to generate a negative drain transconductance (e.g., $g_{ds}$) effect. More particularly, disclosed herein and in the accompanying figures are exemplary environments, methods, and systems implementing a low power buffer with gain boost.

Overview

High resolution, high speed analog-to-digital converters (ADCs) can require buffers to isolate a high impedance track and hold (TAH) stage from one or more sample and hold (SAH) stages preceding the ADC. In some cases, buffers can be used to isolate successive SAH stages. Such buffer implementations can be a key component in enabling and advancing high speed communication (e.g., 100 Gigabit Ethernet) networks and systems. For example, a 28 Gbps serial link communication receiver might require multiple successive approximation register (SAR) ADCs, each with one or more buffers exhibiting at least the following characteristics: wide bandwidth, very fast large signal settling and slewing (e.g., low output impedance), high linearity over the full analog input signal, low noise, high power supply rejection, and high input impedance over the wide bandwidth (e.g., near or in excess of the Nyquist rate). Such receivers might also demand the buffer exhibit low power consumption (e.g., 1V supply voltage), which introduces further demands that the buffer gain to be near unity. For example, Some embodiments of the present disclosure address the problem of implementing a low power buffer that exhibits unity gain across a wide bandwidth to enable advancement of low power, high speed communication systems. More specifically, the techniques disclosed herein provide a buffer with gain boosting using a stacked transistor configuration to generate a negative $g_{ds}$ effect. The negative $g_{ds}$ effect enables an overall buffer gain that meets or exceeds unity, allowing for a lower power consumption. For example, a unity gain buffer providing a signal to an ADC operating at a 1V supply voltage can also operate at a 1V supply voltage (e.g., as compared to a higher supply voltages for gains less than unity), providing both low power consumption by the buffer, and full use of the available ADC dynamic range. The negative $g_{ds}$ effect further provides a lower effective input capacitance that increases the overall buffer bandwidth. The stacked transistor configuration can be deployed in a full differential implementation, and can include techniques for improving linearity, DC level shifts, capacitive input loading, and output slewing, settling, and drive capabilities.

DEFINITIONS

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

DESCRIPTIONS OF EXEMPLARY EMBODIMENTS

FIG. 1 presents a high speed serial link receiver system 100 in an environment that includes buffers. As an option, one or more instances of high speed serial link receiver system 100 or any aspect thereof may be implemented in the context of the architecture and functionality of the embodiments described herein. Also, the high speed serial link receiver system 100 or any aspect thereof may be implemented in any desired environment.

As shown in FIG. 1, the high speed serial link receiver system 100 illustrates an environment that includes low power buffers with gain boost that advance the speed and power capabilities of such systems. For example, the herein disclosed techniques for low power buffers with gain boost enable, in part, the high speed serial link receiver system 100 to be implemented in a low power, 8-lane, 28 Gbps serial link transceiver. The high speed serial link receiver system 100 can also be representative of similar systems in a variety of environments and applications, such as optical serial data communication links and memory data interfaces. Specifically, high speed serial link receiver system 100 receives an input signal 102 at a plurality of variable gain amplifiers 104 (e.g., VGA $104_1$ and VGA $104_2$) that drive amplified input signals to a plurality of 8-bit SAR ADCs 110 (e.g., 8-bit SAR ADC $110_1$, 8-bit SAR ADC $110_2$, 8-bit SAR ADC $110_3$, and 8-bit SAR ADC $110_4$). A set of clocks related to in-phase and quadrature-phase timing (e.g., $CK_I$ 122, $CK_{IB}$ 124, $CK_Q$ 126, and $CK_{QB}$ 128) are delivered to the respective ones of the plurality of 8-bit SAR ADCs 110 by a phase-locked loop (PLL), such as PLL 106, a phase interpolator and delaylocked loop (DLL), such as phase interpolator and DLL 107, and a clock divider 108. For the aforementioned low power, 8-lane, 28 Gbps serial link transceiver implementation, the PLL 106 can operate at 14 GHz, the phase interpolator and DLL 107 can operate at 7 GHz, and the clock divider 108 can provide divide-by-8 capability (e.g., generate a 12.5% duty cycle). As shown, each instance of the plurality of 8-bit SAR ADCs 110 will generate an 8-bit digital representation of the input signal 102 sampled at timing associated with the respective set of input clocks (e.g., $CK_I$ 122, $CK_{IB}$ 124, $CK_Q$ 126, and $CK_{QB}$ 128).

Further details of an instance of the plurality of 8-bit SAR ADCs 110 is shown in 8-bit SAR ADC $110_1$. Specifically, the amplified input signal from VGA $104_1$ is received by a plurality of track-and-hold circuits (e.g., see TAHs 112). Each instance of the plurality of TAHs 112 feeds a respective buffer (e.g., buffer $114_1$ and buffer $114_2$) that, in turn, feeds a plurality of sample-and-hold circuits (e.g., see SAHs 116). Each instance of the plurality of SAHs 116 provides a sampled version of the input signal 102 (e.g., at timing associated with a respective clock from the set of input clocks) to a respective instance of a plurality of ADCs 118. Each instance of the plurality of ADCs 118 compare the sampled version of the input signal 102 to a respective reference voltage (not shown) to produce a 1-bit digital result that is combined with the results of the other instances of the plurality of ADCs 118 to produce the full 8-bit digital representation. Further details regarding the operation and waveforms associated with the plurality of TAHs 112, the plurality of buffers 114, and the plurality of SAHs 116 are described in FIG. 2A and FIG. 2B.

Figure 2A:
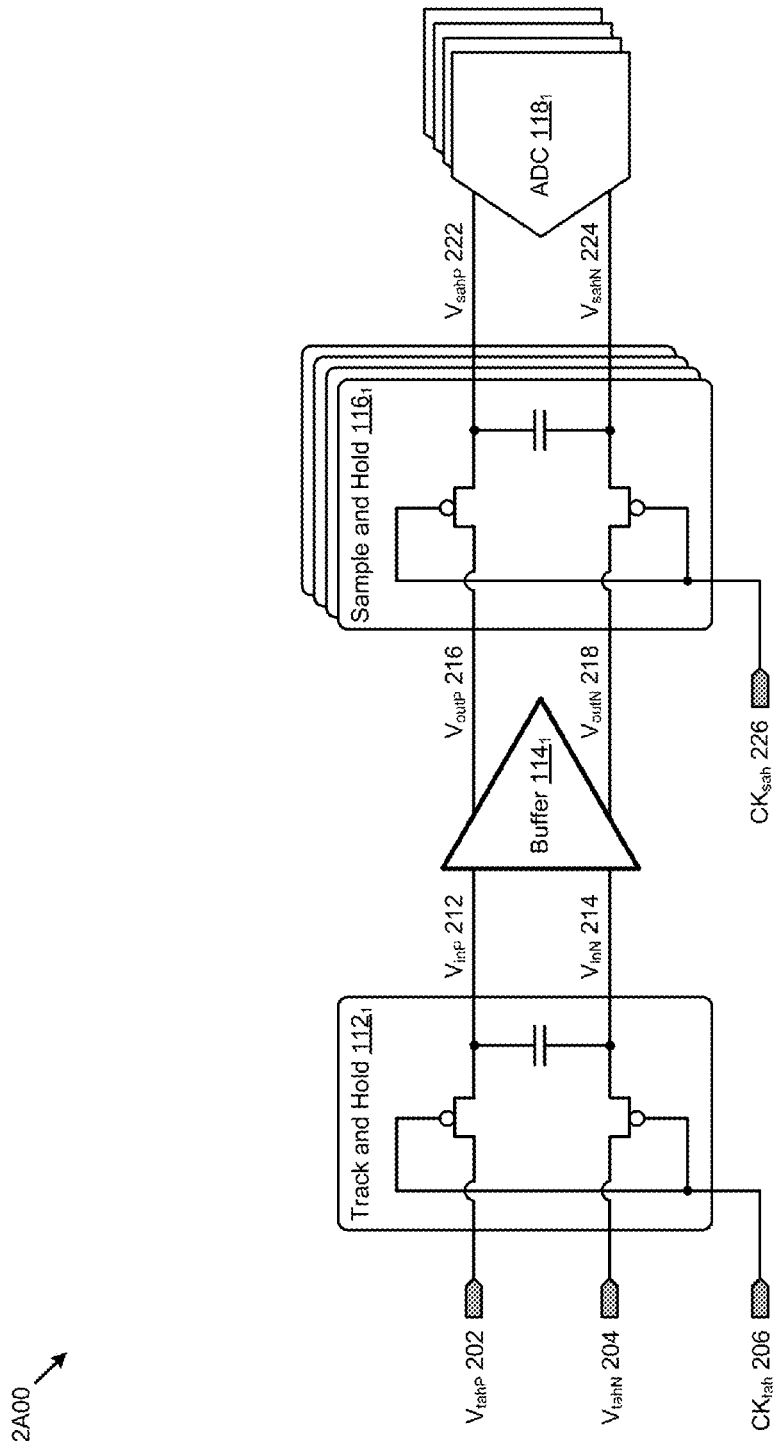
FIG. 2A is a block diagram of a high speed serial link receiver front end that includes a buffer.

FIG. 2A is a block diagram 2A00 of a high-speed serial link receiver front end that includes a buffer. As an option, one or more instances of block diagram 2A00 or any aspect thereof may be implemented in the context of the architecture and functionality of the embodiments described herein. Also, the block diagram 2A00 or any aspect thereof may be implemented in any desired environment.

As shown in FIG. 2A, the block diagram comprises a track-and-hold circuit $112_1$ (e.g., from the plurality of TAHs 112), the buffer $114_1$, a sample-and-hold circuit $116_1$ (e.g., from the plurality of SAHs 116), and an ADC $118_1$ (e.g., from the plurality of ADCs 118). As shown, buffer $114_1$ isolates the high impedance track-and-hold and sample-and-hold stages. Further, as illustrated, buffer $114_1$ can drive multiple sample-and-hold stages that drive multiple respective ADCs. More specifically, the track-and-hold circuit $112_1$ receives a differential input signal across $V_{tahP}$ 202 and $V_{tahN}$ 204 (e.g., from VGA $104_1$, see FIG. 1) that the circuit will "track" when clock $CK_{tah}$ 206 is low and "hold" when clock $CK_{tah}$ 206 is high. As an example, clock $CK_{tah}$ 206 can be included and/or determined from the set of input clocks (e.g., $CK_I$ 122, $CK_{IB}$ 124, $CK_Q$ 126, and $CK_{QB}$ 128). The buffer $114_1$ receives the differential output signal from the track-and-hold circuit $112_1$ across $V_{inP}$ 212 and $V_{inN}$ 214 and drives a differential output signal across $V_{outP}$ 216 and $V_{outN}$ 218.

Figure 2B:
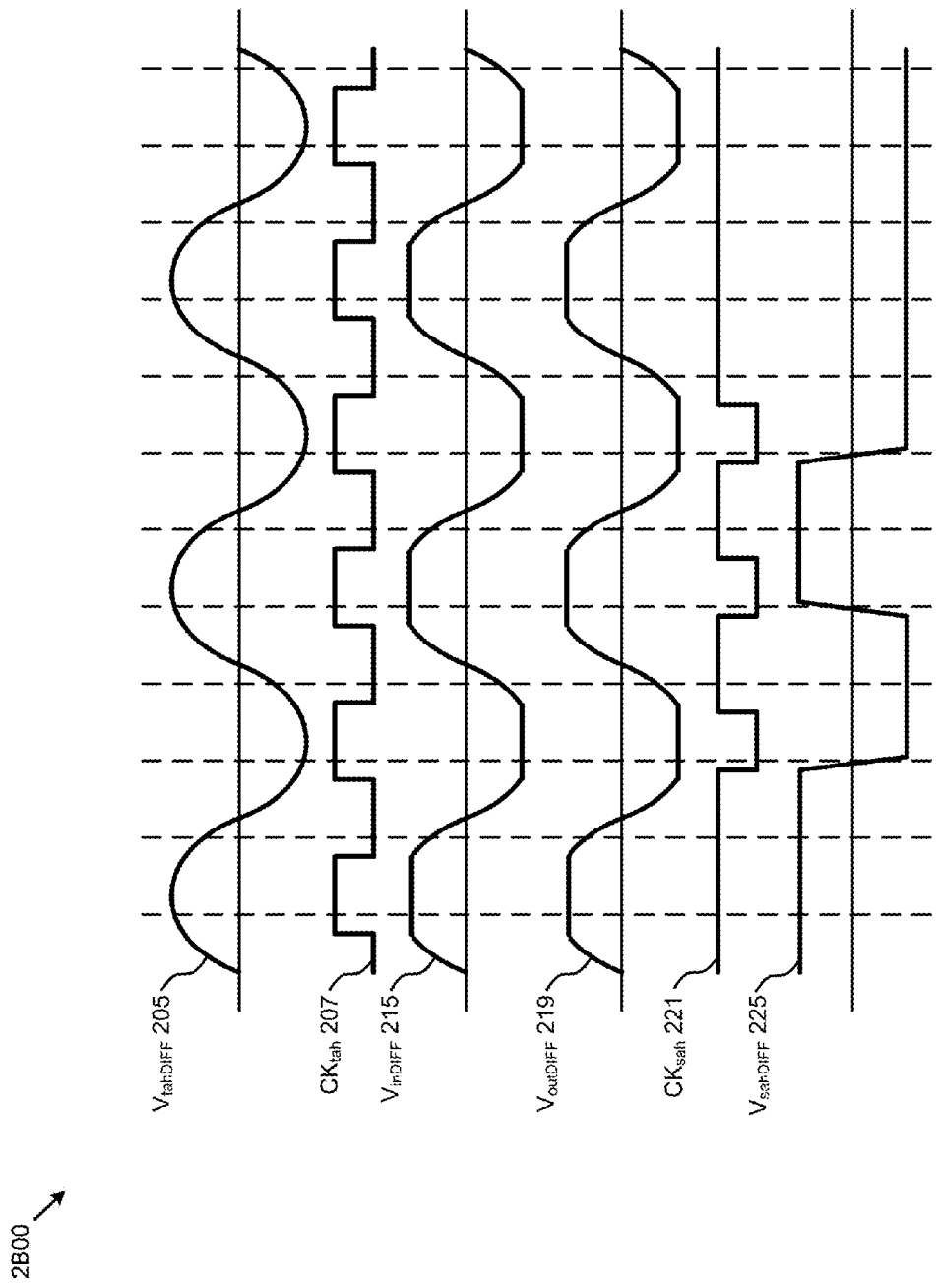
FIG. 2B depicts selected waveforms of a high speed serial link receiver front end that includes a buffer.

As earlier mentioned, in low power, high speed implementations, buffer $114_1$ will need to exhibit at least the following characteristics: wide bandwidth, very fast large signal settling and slewing (e.g., low output impedance), high linearity over the full analog input signal (e.g., input signal 102), low noise, high power supply rejection, and high input impedance over the wide bandwidth. In some cases, the bandwidth can exceed the Nyquist rate (e.g., 17 GHz bandwidth compared to a 14 GHz Nyquist rate in a 28 Gsps receiver) in order to improve total harmonic distortion (THD). The sample-and-hold circuit $116_1$ receives the differential output signal across $V_{outP}$ 216 and $V_{outN}$ 218 (e.g., from buffer $114_1$) that the circuit will "sample" when clock $CK_{sah}$ 226 is low and "hold" when clock $CK_{sah}$ 226 is high. As an example, clock $CK_{sah}$ 226 can be included and/or determined from the set of input clocks (e.g., $CK_I$ 122, $CK_{IB}$ 124, $CK_Q$ 126, and $CK_{QB}$ 128). The sampled differential signal across $V_{sahP}$ 222 and $V_{sanN}$ 224 is provided to ADC $118_1$ for conversion to a 1-bit digital signal. FIG. 2B provides a visual depiction of example signal waveforms received and generated by the components of block diagram 2A00.

FIG. 2B depicts selected waveforms 2B00 of a high-speed serial link receiver front end that includes a buffer. As an option, one or more instances of selected waveforms 2B00 or any aspect thereof may be implemented in the context of the architecture and functionality of the embodiments described herein. Also, the selected waveforms 2B00 or any aspect thereof may be implemented in any desired environment.

As shown in FIG. 2B, selected waveforms 2B00 comprises representations of various signals (e.g., $V_{tahDIFF}$ 205, clock $CK_{tah}$ 206, $V_{inDIFF}$ 215, $V_{outDIFF}$ 219, clock $CK_{sah}$ 226, and $V_{sahDIFF}$ 225) received and generated by the components of block diagram 2A00. More specifically, $V_{tahDIFF}$ 205 represents the differential voltage across $V_{tahP}$ 202 and $V_{tahN}$ 204, $V_{inDIFF}$ 215 represents the differential voltage across $V_{inP}$ 212 and $V_{inN}$ 214, $V_{outDIFF}$ 219 represents the differential voltage across $V_{outP}$ 216 and $V_{outN}$ 218, and $V_{sahDIFF}$ 225 represents the differential voltage across $V_{sahP}$ 222 and $V_{sahN}$ 224. As shown, $V_{tahDIFF}$ 205 can be received by the track-and-hold circuit $112_1$ and tracked when clock $CK_{tah}$ 206 (see $CK_{tah}$ waveform 207) is low and held when clock $CK_{tah}$ 206 is high to produce $V_{inDIFF}$ 215. $V_{inDIFF}$ 215 can then be received by buffer $114_1$ to generate $V_{outDIFF}$ 219. $V_{outDIFF}$ 219 can then be received by the sample-and-hold circuit $116_1$ and sampled when clock $CK_{sah}$ 226 is low (see $CK_{sah}$ waveform 221) and held when clock $CK_{sah}$ 226 is high to produce $V_{sanDIFF}$ 225.

Figures 3A, 3B, 3C:
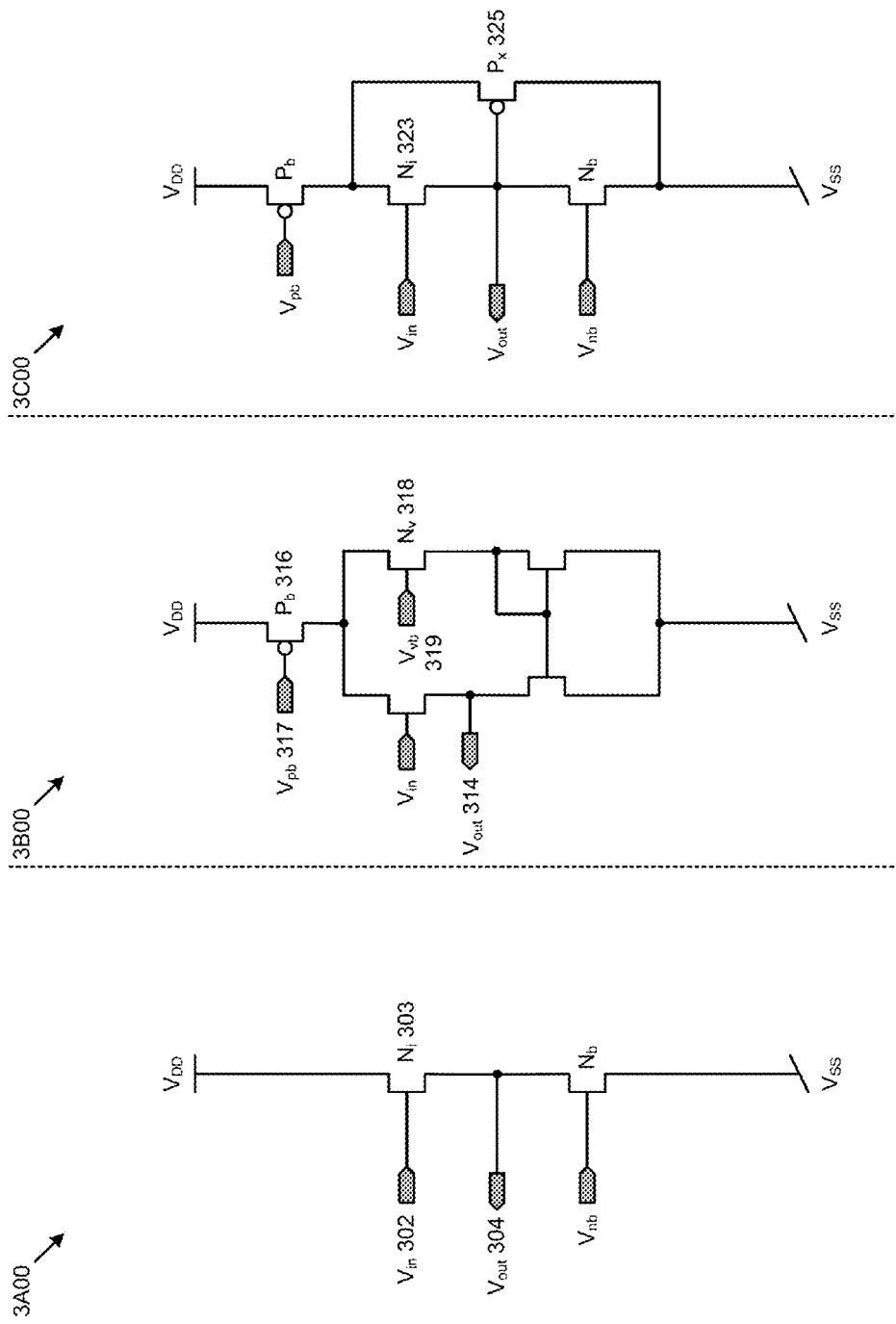
FIG. 3A, FIG. 3B, and FIG. 3C present schematics for comparing buffer implementations.

As shown in FIG. 2B, the waveform of the output voltage (e.g., $V_{outDIFF}$ 219) indicates that buffer $114_1$ has sufficient bandwidth and gain to produce an output voltage (e.g., $V_{outDIFF}$ 219) that replicates the input voltage (e.g., $V_{inDIFF}$ 215) while providing isolation between the track-and-hold and sample-and-hold stages, enabling, in part, a low bit error rate for the high-speed serial link receiver (e.g., by maintaining a full scale signal range at the ADC input such that the maximum ADC resolution is achieved). As speeds increase and power budgets decrease, designing a buffer exhibiting the required bandwidth, gain, power, and other characteristics is increasingly difficult. FIG. 3A, FIG. 3B, and FIG. 3C disclose legacy buffer designs that are limited in one or much such required characteristics.

FIG. 3A, FIG. 3B, and FIG. 3C present schematic 3A00, schematic 3B00, and schematic 3C00 for comparing buffer implementations. As an option, one or more instances of the schematics or any aspect thereof may be implemented in the context of the architecture and functionality of the embodiments described herein. Any aspect of the shown schematics may be implemented in any desired environment.

The buffer implementations shown in FIG. 3A, FIG. 3B, and FIG. 3C, can be compared as follows:

Those skilled in the art will recognize the buffer shown in schematic 3A00 has a source follower configuration. The source follower configuration can exhibit high bandwidth, but has only moderate linearity and large input capacitive loading. Specifically, input device $N_i$ 303 can have a large $C_{gs}$ that provides a charge kickback path to the input voltage $V_{in}$ 302 that can result in slow overall settling at the output voltage $V_{out}$ 304. The source follower configuration shown in schematic 3A00 can also exhibit asymmetrical slewing (e.g., it follows a rising input signal faster than it follows a falling input signal).

The buffer shown in schematic 3B00 also deploys a source follower configuration, but further adds a feedback path to improve the symmetry of the positive and negative slewing current to the output (e.g., $V_{out}$ 314). Specifically, devices $P_b$ 316 and $N_v$ 318 are configured and controlled (e.g., by control voltages $V_{pb}$ 317 and $V_{vb}$ 319, respectively) to provide equal current into and out of $V_{out}$ 314.

The buffer shown in schematic 3C00 enhances the source follower configuration shown in schematic 3A00 to improve the linearity degraded by the $g_{ds}$ modulation of device $N_i$ 323. Specifically, device $P_x$ 325 $V_{ds}$ of device $N_i$ 323 is near constant, offsetting output impedance effects of device $N_i$ 323 generated during circuit operation.

While the buffer configurations shown in schematic 3A00, schematic 3B00, and schematic 3C00 all exhibit various positive attributes, no such legacy buffer designs address the problem of implementing a low power buffer that exhibits unity gain across a wide bandwidth to enable advancement of low power, high speed communication systems. Specifically, in practical high speed implementations, all three buffer configurations exhibit both a DC level shift and a signal gain G less than unity (e.g., 0.7 to 0.8). The DC level shift and attenuation needs an increased buffer input voltage in order to maintain a full scale signal range at the ADC input such that the maximum ADC resolution is achieved. The larger buffer input voltage (e.g., 1.25 to 1.43 times the required buffer output voltage) results in a lower linearity and distortion performance in the buffers preceding the ADCs. Such lower linearity and distortion performance can be improved by increasing the supply voltage (e.g., $V_{DD}$) to permit the larger buffer input voltage swings. However, increasing the supply voltage will increase the power consumption of the buffer and overall system. Further, if more than one buffer is in the chain between the input signal (e.g., input signal 102) and the ADCs (e.g., ADCs 118), the resulting signal level at the input to the signal chain is $(1/G)^n$ times the signal level required at the output of the signal chain (e.g., at ADCs 118), where n is the number of buffers in the chain. The aforementioned linearity, distortion, and power consumption issues will also increase according to the number n of buffers in the chain.

Techniques are therefore needed to address the problem of implementing a low power buffer that exhibits unity gain across a wide bandwidth. None of the aforementioned legacy approaches achieve the capabilities of the herein-disclosed techniques for low power buffer with gain boost described in the following figures.

Figures 4A, 4B:
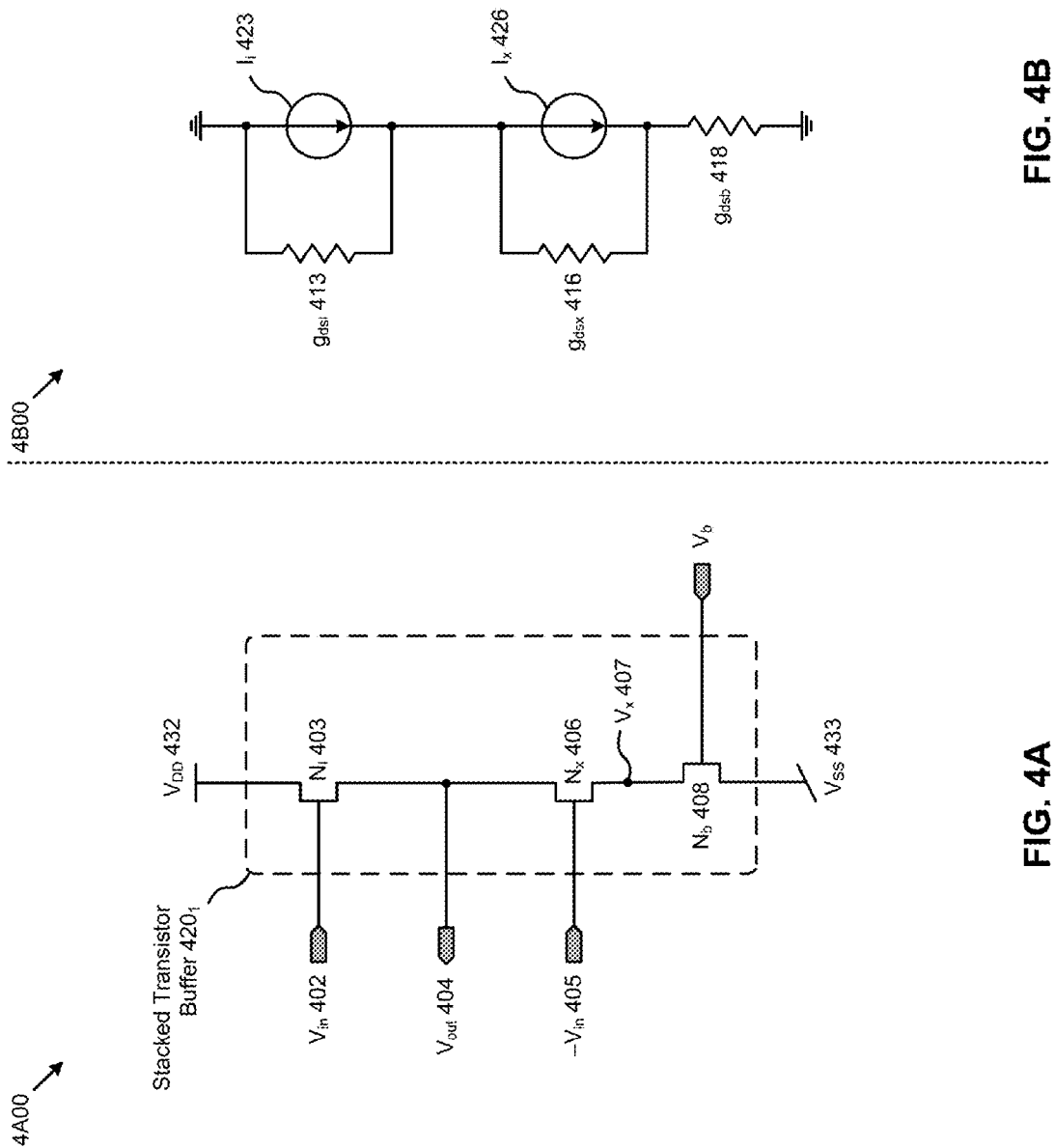
FIG. 4A is a schematic of a stacked transistor configuration as used to implement a low power buffer with gain boost, according to an embodiment.
FIG. 4B is a schematic depicting a small signal representation of a stacked transistor configuration as used to implement a low power buffer with gain boost, according to an embodiment.

FIG. 4A is a schematic 4A00 of a stacked transistor configuration as used to implement a low power buffer with gain boost. As an option, one or more instances of schematic 4A00 or any aspect thereof may be implemented in the context of the architecture and functionality of the embodiments described herein. Also, schematic 4A00 or any aspect thereof may be implemented in any desired environment.

As shown in FIG. 4A, schematic 4A00 depicts an instance of a stacked transistor buffer $420_1$ comprising a device $N_i$ 403 coupled to a positive power supply $V_{DD}$ 432 and coupled to (e.g., "stacked" on) a device $N_x$ 406. The stacked transistor buffer $420_1$ further comprises a device $N_b$ 408 (e.g., to provide a bias current) coupled to device $N_x$ 406 and a negative power supply $V_{SS}$ 433. Device $N_i$ 403 and device $N_x$ 406 receive input voltage $V_{in}$ 402 and input voltage $-V_{in}$ 405, respectively, where input voltage $-V_{in}$ 405 is the complement of input voltage $V_{in}$ 402. A second signal that is a complement of a first signal is of equal magnitude and opposite polarity from that of the first signal with respect to a common reference. For example, a first voltage signal $V_1$ at +300 mV above a 500 mV voltage reference (e.g., $V_1$=800 mV) would have a complementary second voltage signal $V_2$ at −300 mV below the 500 mV voltage reference (e.g., $V_2$=200 mV). Such complementary signals (e.g., differential signals) are available in many electronic systems (e.g., high speed communications systems). An output voltage $V_{out}$ 404 is provided at the node where device $N_i$ 403 is coupled to device $N_x$ 406.

A "gain boost" is provided by the stacked transistor buffer $420_1$, due, in part, to the in-phase contribution to the output voltage $V_{out}$ 404 of the two transistors in response to the input voltage $V_{in}$ 402 and its complement, input voltage $-V_{in}$ 405. Specifically, the device $N_i$ 403 is configured (e.g., with load devices) to generate a non-inverting response to input voltage $V_{in}$ 402, and the device $N_x$ 406 is configured (e.g., with load devices) to generate an inverting response to input voltage $-V_{in}$ 405 such that the combined contributions of both transistors "boost" the voltage at output voltage $V_{out}$ 404. More specifically, as input voltage $V_{in}$ 402 increases, output voltage $V_{out}$ 404 increases, but input voltage $-V_{in}$ 405 decreases, reducing the current through device $N_b$ 408 such that the gain is not reduced. The amount of the gain boost and overall gain of the stacked transistor buffer $420_1$ can be determined, in part, by various device attributes (e.g., device size or dimensions). Further details regarding the operation and gain components of the stacked transistor buffer $420_1$ are described in FIG. 4B.

FIG. 4B is a schematic 4B00 depicting a small signal representation of a stacked transistor configuration as used to implement a low power buffer with gain boost. As an option, one or more instances of schematic 4B00 or any aspect thereof may be implemented in the context of the architecture and functionality of the embodiments described herein. Also, schematic 4B00 or any aspect thereof may be implemented in any desired environment.

As shown in FIG. 4B, the stacked transistor buffer $420_1$ (e.g., see schematic 4A00) can be represented by a small signal equivalent circuit as shown in schematic 4B00. Specifically, device $N_i$ 403 is represented by a current source $I_i$ 423 in parallel with a transconductance $g_{dsi}$ 413, device $N_x$ 406 is represented by a current source $I_x$ 426 in parallel with a transconductance $g_{dsx}$ 416, and device $N_b$ 408 is represented by a transconductance $g_{dsb}$ 418. The current flowing through current source $I_i$ 423 and current source $I_x$ 426 can be described as follows:

$$I_i = g_{mi}(V_{in} - V_{out}) \qquad \text{[EQ. 1]}$$

$$I_x = g_{mx}(-V_{in} - V_x) \qquad \text{[EQ. 2]}$$

where:
$g_{mi}$ is the transconductance of device $N_i$ 403,
$g_{mx}$ is the transconductance of device $N_x$ 406, and
$V_x$ is the voltage at node $V_x$ 407.

The gain G of the stacked transistor buffer $420_1$ can then be represented by:

$$G = V_{out}/V_{in} = [g_{mi} + g_{mx}(1-\alpha)]/[g_{mi} + g_{dsi} + g_{dsx}(1-\alpha)] \qquad \text{[EQ. 3]}$$

where:

$\alpha = [g_{mx} + g_{dsx}]/[g_{mx} + g_{dsx} + g_{dsb}]$.

The second term (e.g., $g_{mx}(1-\alpha)$) in the numerator of [EQ. 3] is not present in the gain equation of a source follower configuration (e.g., see schematic 3A00) and is the mathematical representation of the gain boost capability of the stacked transistor configuration. Specifically, the stacked transistor configuration is able to meet or exceed unity gain by sizing and/or biasing the devices shown in schematic 4A00. Other device attributes can also contribute to the gain. The offsetting or "negative" transconductance $g_{dsx}$ 416 of device $N_x$ 406 that helps boost the gain also serves to offset device capacitances to create a lower effective impedance, thereby increasing the bandwidth of the stacked transistor buffer 420$_1$. A full differential implementation of the herein disclosed stacked transistor configuration is shown in FIG. 5A below.

Figure 5A:
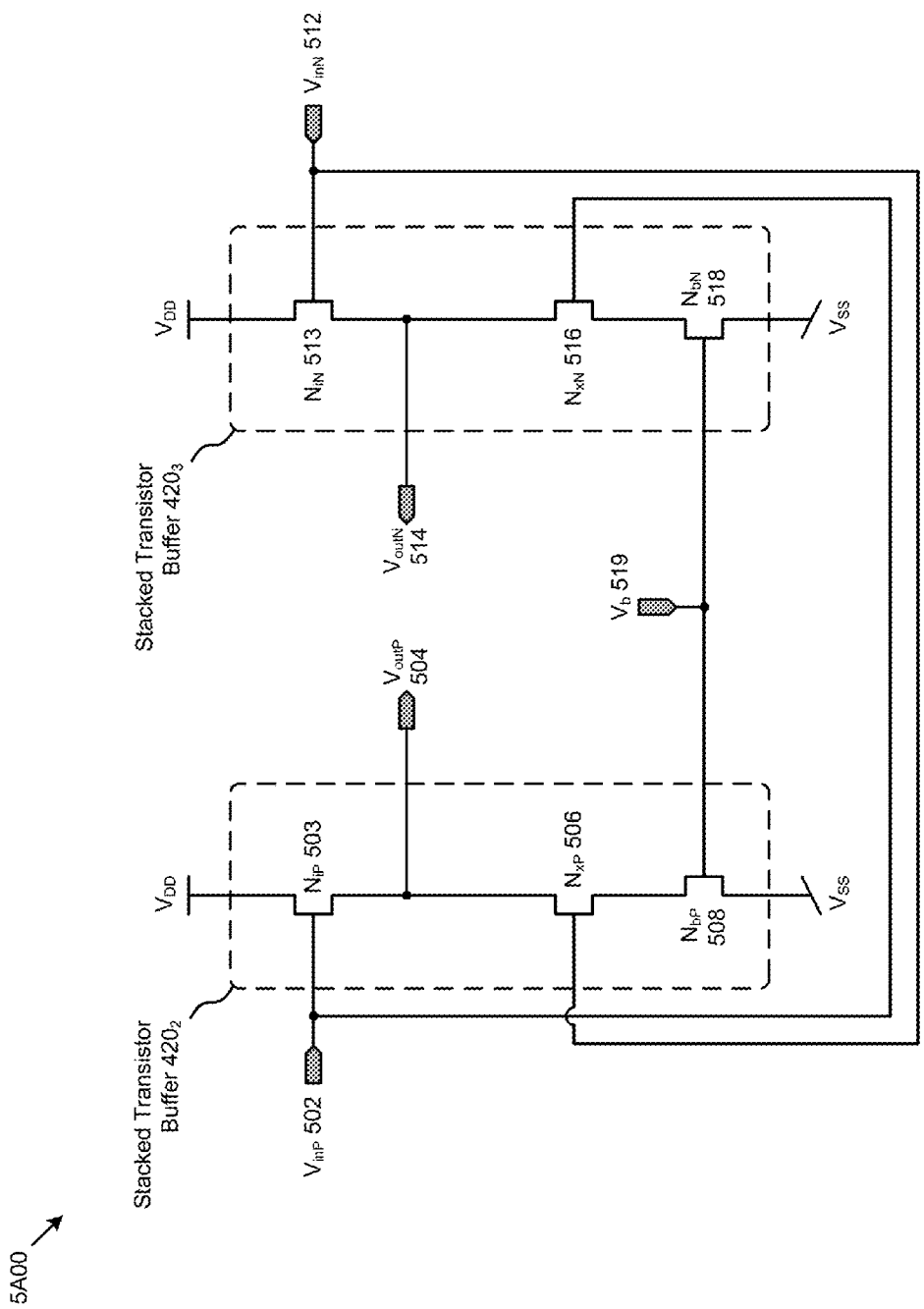
FIG. 5A is a schematic of a differential stacked transistor implementation of a low power buffer with gain boost, according to an embodiment.

FIG. 5A is a schematic 5A00 of a differential stacked transistor implementation of a low power buffer with gain boost. As an option, one or more instances of schematic 5A00 or any aspect thereof may be implemented in the context of the architecture and functionality of the embodiments described herein. Also, schematic 5A00 or any aspect thereof may be implemented in any desired environment.

As shown in FIG. 5A, schematic 5A00 depicts two instances of the stacked transistor buffer 420$_1$ shown in schematic 4A00 (e.g., stacked transistor buffer 420$_2$ and stacked transistor buffer 420$_3$) coupled together to receive a differential input signal across an input voltage V$_{inP}$ 502 and an input voltage V$_{inN}$ 512, and produce a differential output signal across an output voltage V$_{outP}$ 504 and an output voltage V$_{outN}$ 514. Specifically, the stacked transistor buffer 420$_2$ produces the output voltage V$_{outP}$ 504 and comprises a device N$_{iP}$ 503 and a device N$_{xP}$ 506 that receive input voltage V$_{inP}$ 502 and input voltage V$_{inN}$ 512, respectively, where input voltage V$_{inN}$ 512 is the complement of input voltage V$_{inN}$ 502. The stacked transistor buffer 420$_2$ further comprises a device N$_{bP}$ 508 coupled to the device N$_{xP}$ 506 and controlled by a bias voltage V$_b$ 519 (e.g., to provide a bias current). As also shown in schematic 5A00, the stacked transistor buffer 420$_3$ produces the output voltage V$_{outN}$ 514 and comprises a device N$_{iN}$ 513 and a device N$_{xN}$ 516 that receive input voltage V$_{inN}$ 512 and input voltage V$_{inP}$ 502, respectively, where input voltage V$_{inP}$ 502 is the complement of input voltage V$_{inN}$ 512. The stacked transistor buffer 420$_3$ further comprises a device N$_{bN}$ 518 coupled to the device N$_{xN}$ 516 and controlled by the bias voltage V$_b$ 519 (e.g., to provide a bias current).

The common mode voltage at input voltage V$_{inP}$ 502 and input voltage V$_{inN}$ 512 can vary such that linearity and THD are impacted. For example, in the high speed serial link receiver system 100 of FIG. 1, an instance of VGA 104$_1$ can exhibit variations in performance over changes in the manufacturing process, operating voltage, and operating temperature such that a range of common mode voltages are presented to instances of buffer 114$_1$ and buffer 114$_2$. One technique for correcting for common mode voltage variations is presented in FIG. 5B.

Figure 5B:
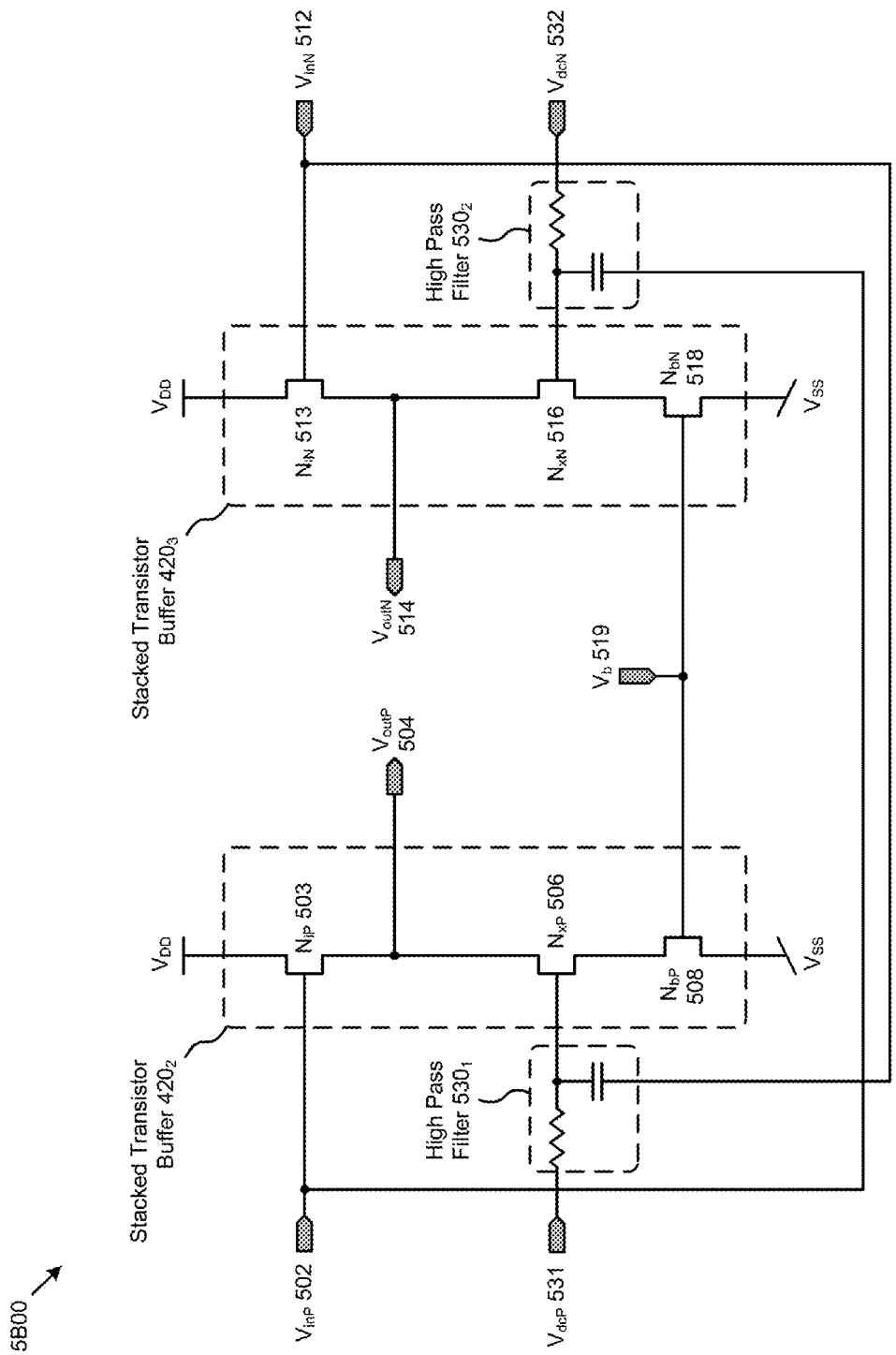
FIG. 5B is a schematic of a common mode voltage correction technique as used to implement a low power buffer with gain boost, according to an embodiment.

FIG. 5B is a schematic 5B00 of a common mode voltage correction technique as used to implement a low power buffer with gain boost, according to an embodiment. As an option, one or more instances of schematic 5B00 or any aspect thereof may be implemented in the context of the architecture and functionality of the embodiments described herein. Also, the schematic 5B00 or any aspect thereof may be implemented in any desired environment.

Schematic 5B00 depicts the differential stacked transistor implementation of FIG. 5A with modifications. Specifically, a high-pass filter 530$_1$ is inserted in the path connecting input voltage V$_{inN}$ 512 to device N$_{xP}$ 506, and a high-pass filter 530$_2$ is inserted in the path connecting input voltage V$_{inP}$ 502 to device N$_{xN}$ 516. Also, the DC bias voltage for device N$_{xP}$ 506 is provided by a bias voltage V$_{dcN}$ 532, and the DC bias voltage for device N$_{xN}$ 516 is provided by a bias voltage V$_{dcN}$ 532. In the configuration shown in schematic 5B00, the common mode voltage components (e.g., up to 10 MHz) of the input signal are blocked from device N$_{xN}$ 516 and device N$_{xP}$ 506, and the DC operating point is instead controlled by bias voltage V$_{dcN}$ 532 and bias voltage V$_{dcP}$ 531, respectively, such that improvements in linearity and THD are achieved.

The differential low power buffers with gain boost shown in schematic 5A00 and schematic 5B00 can provide unity gain by appropriately sizing device N$_{xP}$ 506, device N$_{xN}$ 516, device N$_{bP}$ 508, and device N$_{bN}$ 518 for a given bias current (e.g., controlled by bias voltage V$_b$ 519). While the negative $g_{ds}$ effects (e.g., of device N$_{xP}$ 506 and device N$_{xN}$ 516) in the design shown in schematic 5A00 and schematic 5B00 allow for unity gain across a wide bandwidth (e.g., 50 GHz in 28 nm CMOS), improvements to DC level shifts, capacitive input loading, linearity (e.g., due to $g_{ds}$ modulation), and output slewing, settling, and drive capability are possible. Such improvements are described in the implementations shown in FIG. 6 and FIG. 7.

Figure 6:
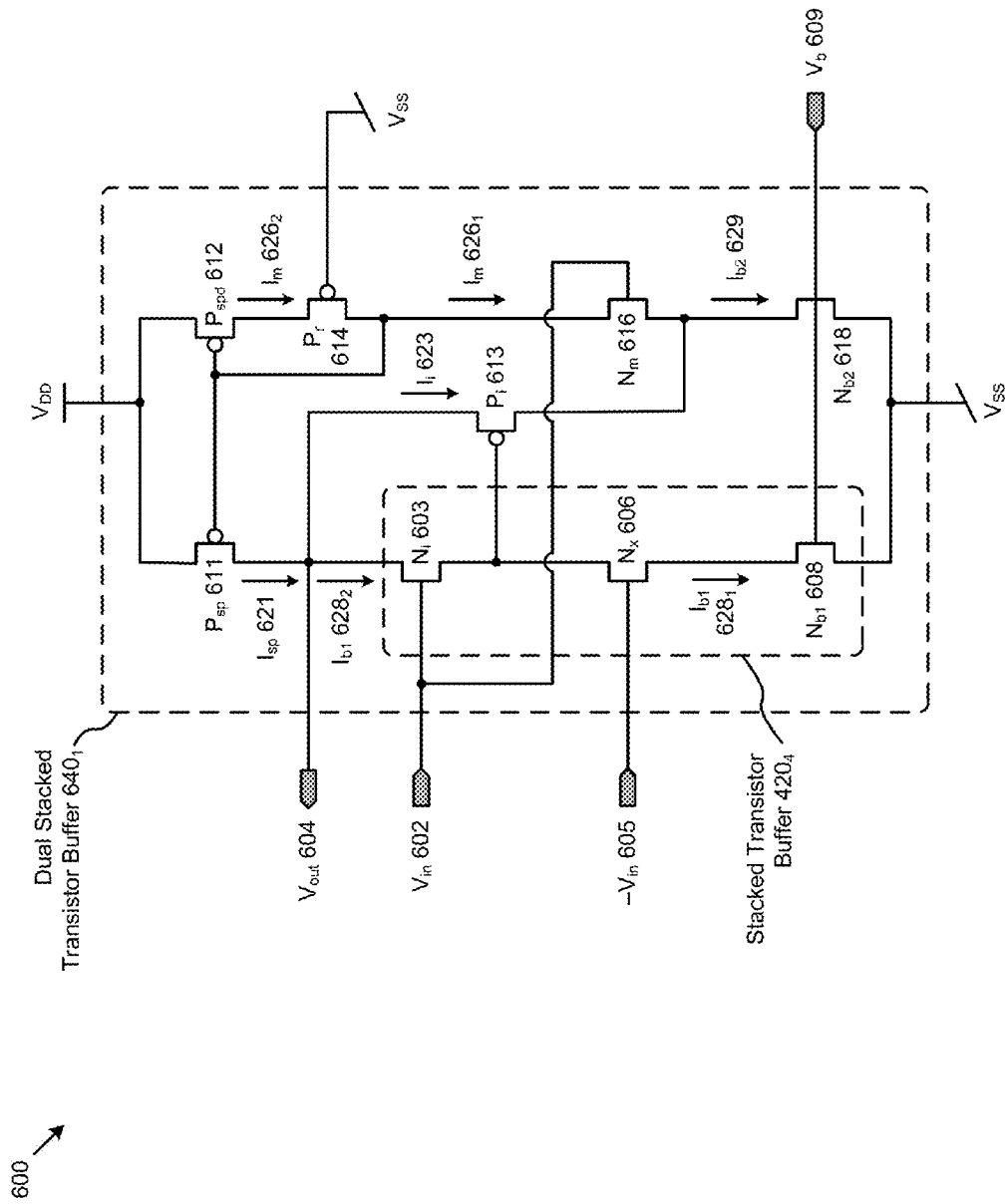
FIG. 6 is a schematic of a dual stacked transistor configuration as used to implement a low power buffer with gain boost, according to an embodiment.

FIG. 6 is a schematic 600 of a dual stacked transistor configuration as used to implement a low power buffer with gain boost. As an option, one or more instances of schematic 600 or any aspect thereof may be implemented in the context of the architecture and functionality of the embodiments described herein. Also, the schematic 600 or any aspect thereof may be implemented in any desired environment.

As shown in FIG. 6, schematic 600 depicts an instance of a dual stacked transistor buffer 640$_1$ that includes an instance of the stacked transistor buffer 420$_4$ (e.g., see schematic 4A00) comprising a device N$_i$ 603, a device N$_x$ 606, and a device N$_{b1}$ 608 controlled by a bias voltage V$_b$ 609. To achieve the aforementioned performance improvements, a second stacked transistor configuration is added comprising a device P$_i$ 613, a device N$_m$ 616, and a device N$_{b2}$ 618 controlled by the bias voltage V$_b$ 609. Device N$_i$ 603 and device N$_x$ 606 receive an input voltage V$_{in}$ 602 and an input voltage –V$_{in}$ 605, respectively, where input voltage –V$_{in}$ 605 is the complement of input voltage V$_{in}$ 602. An output voltage V$_{out}$ 604 is provided at the drain of device N$_i$ 603 (e.g., as compared to the output voltage V$_{out}$ 404 at the source of device N$_i$ 403 in schematic 4A00). The addition of the device P$_i$ 613 provides several benefits. Specifically, device P$_i$ 613 compensates for $g_{ds}$ modulation effects of device N$_i$ 603, thereby improving linearity and THD. Further, device N$_i$ 603 (e.g., N-type MOSFET device) and device P$_i$ 613 (e.g., P-type MOSFET device) are coupled (e.g., as an N-type source follower in series with a P-type source follower) such that the common mode voltage is maintained between input voltage V$_{in}$ 602 and output voltage V$_{out}$ 604 (e.g., there is no DC level shift). This dual source follower configuration further lowers the input capacitive loading (e.g., 80% reduction). Also, the shown coupling of device N$_m$ 616 to the input voltage V$_{in}$ 602 and device P$_i$ 613 serves to compensate for $g_{ds}$ modulation effects of device P$_i$ 613, further improving linearity and THD.

As shown, a current I$_i$ 623 through device P$_i$ 613 can also be used with a class AB output stage to control and improve slewing, settling, and output load drive capability. Specifically, a device $P_{sp}$ 611 and device $N_i$ 603 comprise the class AB output stage, such that device $N_i$ 603 sinks current from output voltage $V_{out}$ 604 when input voltage $V_{in}$ 602 goes high, and device $P_{sp}$ 611 sources current to output voltage $V_{out}$ 604 when input voltage $V_{in}$ 602 goes low. A current $I_{sp}$ 621 from device $P_{sp}$ 611 is derived from the current through device $N_m$ 616 (e.g., see current $I_m$ 626$_1$ and current $I_m$ 626$_2$) using a current mirror configuration comprising device $P_{sp}$ 611, a device $P_{spd}$ 612, and a device $P_r$ 614. The current $I_m$ 626$_1$ is further related to current $I_i$ 623 and a current $I_{b2}$ 629, which in turn is related to a current $I_{b1}$ 628$_1$ (e.g., and current $I_{b1}$ 628$_2$) through a common connection of the bias voltage $V_b$ 609 to device $N_{b1}$ 608 and device $N_{b2}$ 618. By sizing device $N_{b1}$ 608 relative to device $N_{b2}$ 618 (e.g., 1:M, 1:5, etc.), and sizing device $P_{spd}$ 612 relative to device $P_{sp}$ 611 (e.g., 1:N, 4:6, etc.), the relationships among the aforementioned currents shown in schematic 600 are as follows:

$$I_{b2} = M I_{b1} \qquad [\text{EQ. 4}]$$

$$I_{sp} = N I_m \qquad [\text{EQ. 5}]$$

$$I_i = N I_m - I_{b1} \qquad [\text{EQ. 6}]$$

$$I_m = [(M+1)/(N+1)] I_{b1} \qquad [\text{EQ. 7}]$$

Figure 7:
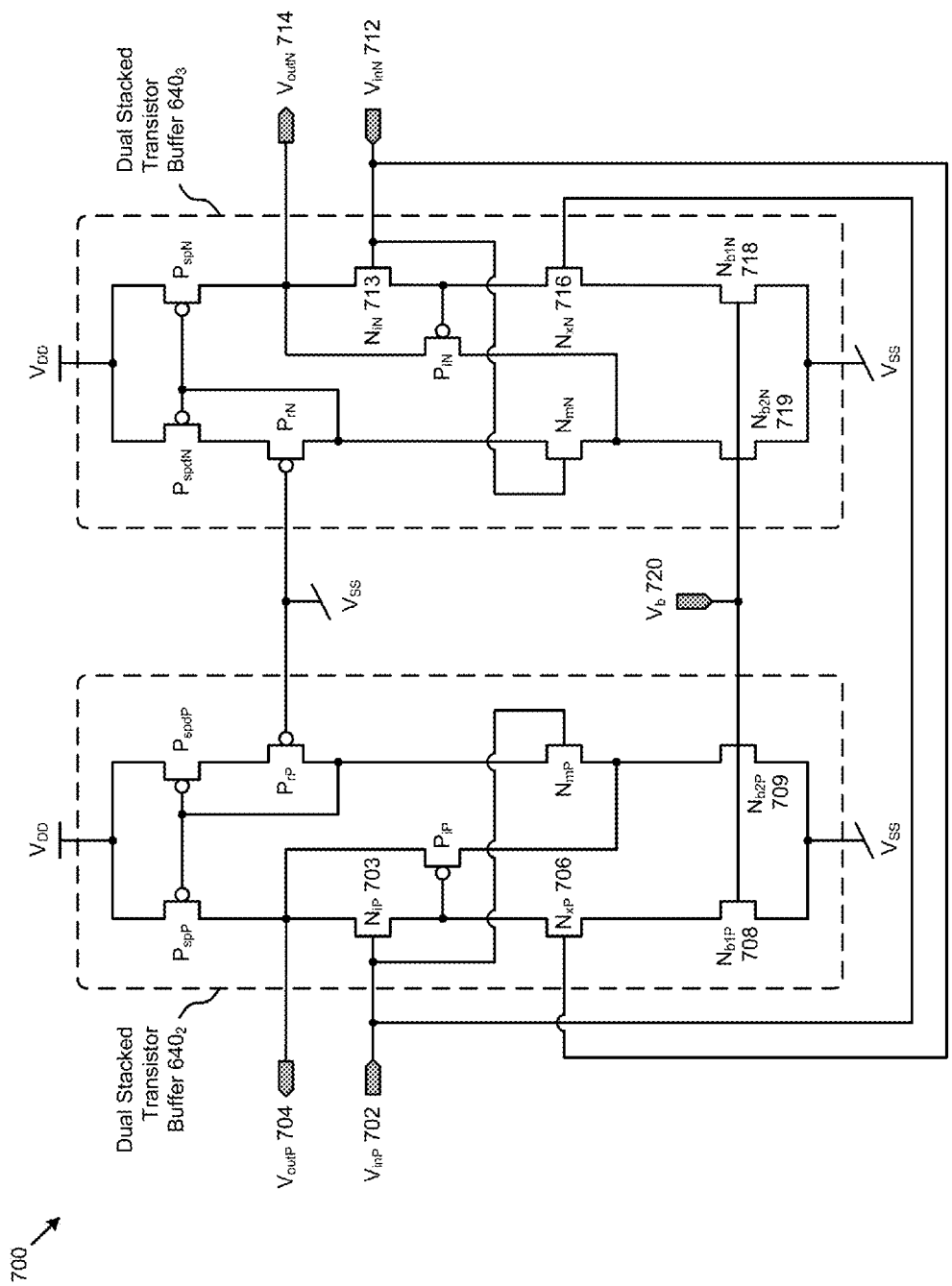
FIG. 7 is a schematic of a differential dual stacked transistor implementation of a low power buffer with gain boost, according to an embodiment.

FIG. 7 is a schematic 700 of a differential dual stacked transistor implementation of a low power buffer with gain boost. As an option, one or more instances of schematic 700 or any aspect thereof may be implemented in the context of the architecture and functionality of the embodiments described herein. Also, the schematic 700 or any aspect thereof may be implemented in any desired environment.

As shown in FIG. 7, schematic 700 depicts two instances of the dual stacked transistor buffer 640$_1$ shown in schematic 600 (e.g., dual stacked transistor buffer 640$_2$ and dual stacked transistor buffer 640$_3$) coupled together to receive a differential input signal across an input voltage $V_{inP}$ 702 and an input voltage $V_{inN}$ 712, and produce a differential output signal across an output voltage $V_{outP}$ 704 and an output voltage $V_{outN}$ 714. Specifically, the dual stacked transistor buffer 640$_2$ produces the output voltage $V_{outP}$ 704 and comprises a device $N_{iP}$ 703 and a device $N_{xP}$ 706 that receive input voltage $V_{inP}$ 702 and input voltage $V_{inN}$ 712, respectively, where input voltage $V_{inN}$ 712 is the complement of input voltage $V_{inP}$ 702. The dual stacked transistor buffer 640$_2$ further comprises a device $N_{b1P}$ 708 and a device $N_{b2P}$ 709 (e.g., to provide a set of bias currents) controlled by a bias voltage $V_b$ 720. As also shown in schematic 5A00, the dual stacked transistor buffer 640$_3$ produces the output voltage $V_{outN}$ 714 and comprises a device $N_{iN}$ 713 and a device $N_{xN}$ 716 that receive input voltage $V_{inN}$ 712 and input voltage $V_{inP}$ 702, respectively, where input voltage $V_{inP}$ 702 is the complement of input voltage $V_{inN}$ 712. The dual stacked transistor buffer 640$_3$ further comprises a device $N_{b1N}$ 718 and a device $N_{b2N}$ 719 (e.g., to provide a set of bias currents) controlled by the bias voltage $V_b$ 720. A description of the remaining components comprising the dual stacked transistor buffer 640$_2$ and the dual stacked transistor buffer 640$_3$ is disclosed in FIG. 6.

ADDITIONAL EMBODIMENTS OF THE DISCLOSURE

Figure 8A:
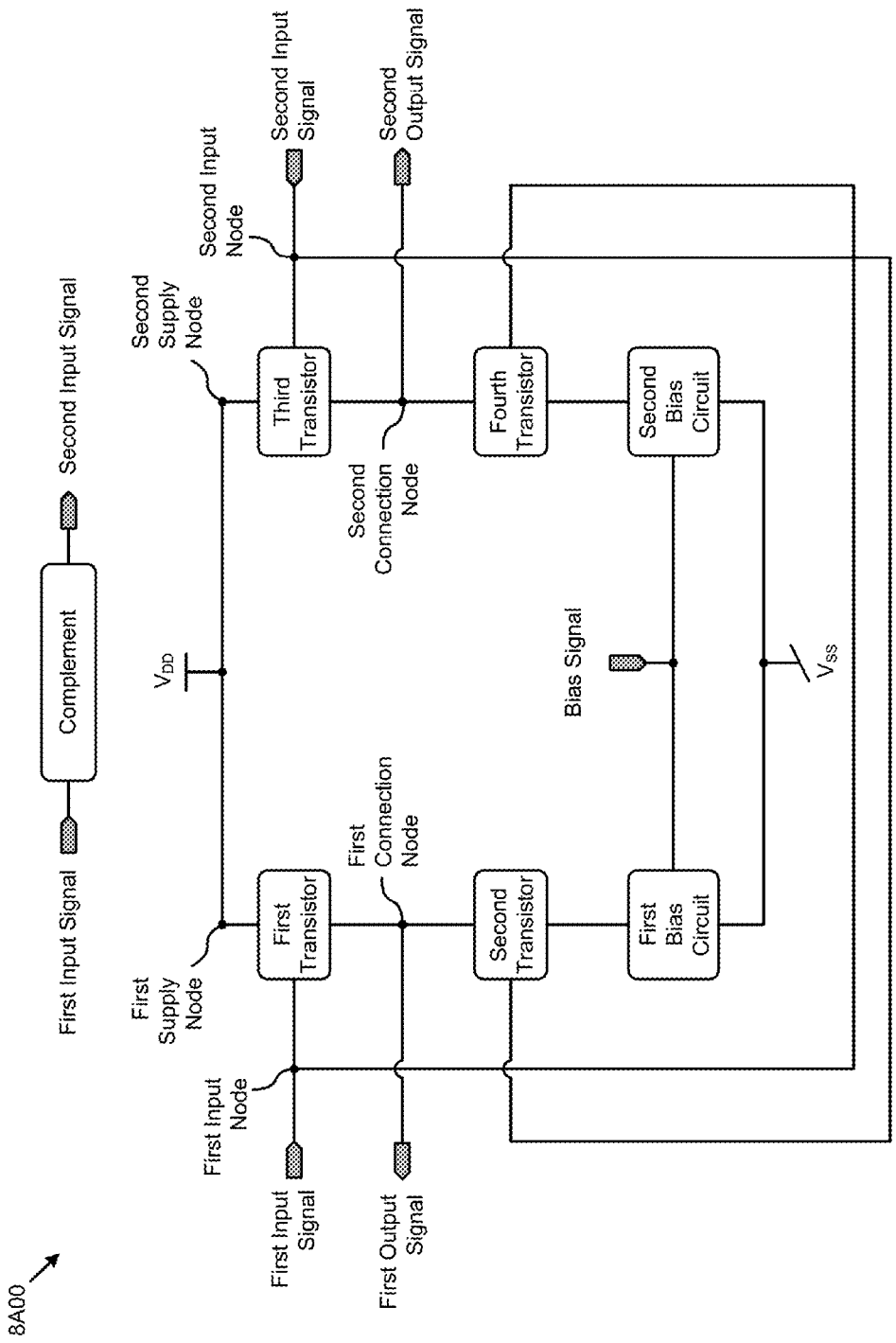
FIG. 8A and FIG. 8B are block diagrams of low power buffers with gain boost, according to some embodiments.
Figure 8B:
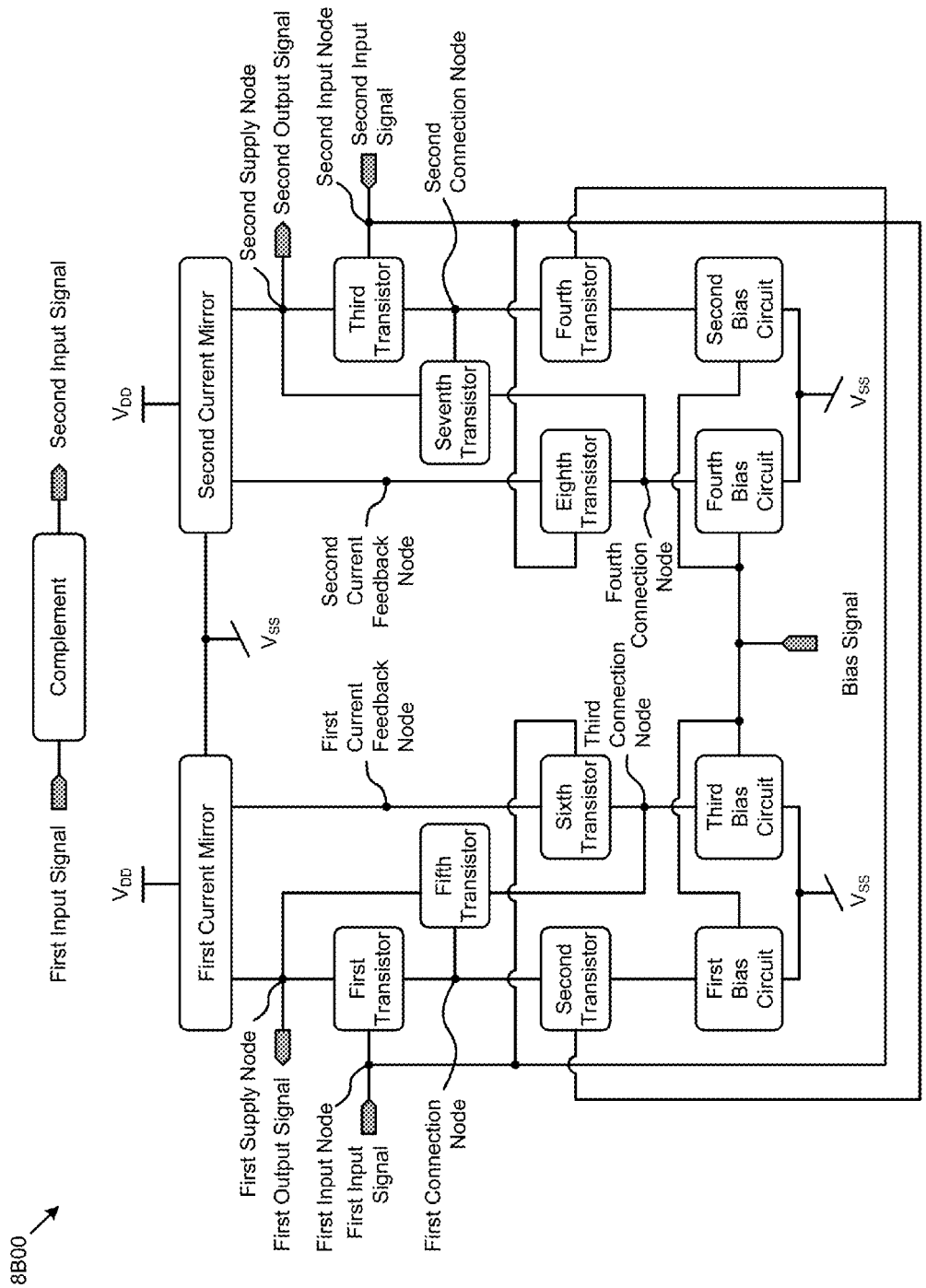

FIG. 8A and FIG. 8B are block diagram 8A00 and block diagram 8B00, respectively, of low power buffers with gain boost, according to some embodiments. As an option, one or more instances of block diagram 8A00 and block diagram 8B00 or any aspect thereof may be implemented in the context of the architecture and functionality of the embodiments described herein. Also, block diagram 8A00 and block diagram 8B00 or any aspect thereof may be implemented in any desired environment.

Shown in block diagram 8A00 is a buffer circuit comprising: a first input node to receive a first input signal; a second input node to receive a second input signal; a first connection node; a second connection node; a first supply node; a second supply node; a first transistor coupled to the first input node, the first supply node, and the first connection node; a second transistor coupled to the second input node and the first connection node; a third transistor coupled to the second input node, the second supply node, and the second connection node; a fourth transistor coupled to the first input node and the second connection node; a first bias circuit coupled to the second transistor; and a second bias circuit coupled to the fourth transistor; wherein the second input signal is a complement of the first input signal.

More specifically, the second input signal is of equal magnitude and opposite polarity from that of the first input signal with respect to a common reference. For example, a first voltage signal $V_1$ at +300 mV above a 500 mV voltage reference (e.g., $V_1$=800 mV) would have a complementary second voltage signal $V_2$ at −300 mV below the 500 mV voltage reference (e.g., $V_2$=200 mV). Such complementary signals (e.g., differential signals) are available in many electronic systems (e.g., high speed communications systems). Further details regarding block diagram 8A00 and 8B00 are described in the herein disclosed embodiments.

It should be noted that there are alternative ways of implementing the embodiments disclosed herein. Accordingly, the embodiments and examples presented herein are to be considered as illustrative and not restrictive, and the claims are not to be limited to the details given herein, but may be modified within the scope and equivalents thereof.

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. A communication system comprising:
   a clock source for providing a clock signal;
   an ADC module comprising a buffer circuit, wherein the buffer circuit comprises:
      a first connection node, a first supply node, a third connection node, a first current feedback node;
      a first transistor coupled to the first supply node and the first connection node, the first transistor being configured to process a first input signal;
      a second transistor coupled to the first connection node, the second transistor being configured to process a second input signal, the second input signal being a complement of the first input signal;
      a fifth transistor coupled to the first connection node, the first supply node, and the third connection node;
      a sixth transistor coupled to the first current feedback node and the third connection node;

a first bias circuit coupled to the second transistor;
a third bias circuit coupled to the sixth transistor; and
a first current mirror coupled to the first current feedback node and the first supply node.

2. The system of claim 1, wherein at least one of, the first bias circuit, or the third bias circuit, is controlled by a bias signal.

3. The system of claim 1 wherein the clock source comprises a PLL module.

4. The system of claim 1 wherein the clock source comprises a clock divider module.

5. The system of claim 1 further comprising one or more variable gain amplifiers for processing the first input signal and the second input signal.

6. The system of claim 1 wherein the ADC module further comprises a plurality of shift and hold registers.

7. The system of claim 1 further comprising a phase interpolator module.

8. The system of claim 1 wherein the ADC module further comprises a plurality of track and hold registers.

9. The system of claim 1, wherein the first transistor, the second transistor, the fifth transistor, the sixth transistor, the first bias circuit, and the third bias circuit have a respective plurality of design attributes, and wherein at least one of the respective plurality of design attributes is established to achieve a gain equal to a first target gain of one, the gain being defined by an output amplitude of a first output signal at the first connection node divided by an input amplitude of the first input signal.

10. The system of claim 1, wherein at least one of the first transistor, the second transistor, the sixth transistor, the first bias circuit, and the third bias circuit comprise an N-type MOSFET device, and wherein the fifth transistor comprises a P-type MOSFET device.

11. A buffer circuit device comprising:
a first connection node;
a third connection node;
a first supply node;
a first current feedback node;
a first transistor coupled to the first supply node and the first connection node, the first transistor being configured to process a first input signal, the first transistor comprises a MOSFET device;
a second transistor coupled to the first connection node, the second transistor being configured to process a second input signal, the second input signal being a complement of the first input signal;
a fifth transistor coupled to the first connection node, the first supply node, and the third connection node;
a sixth transistor coupled to the first current feedback node and the third connection node;
a first bias circuit coupled to the second transistor;
a third bias circuit coupled to the sixth transistor; and
a first current mirror coupled to the first current feedback node and the first supply node.

12. The device of claim 11 further comprising a first input node for receiving the first input signal and a second input node for receiving the second input signal.

13. The device of claim 12, wherein the first transistor and the sixth transistor are coupled to the first input node, and wherein the second transistor is coupled to the second input node.

14. The device of claim 11, wherein the first transistor, the second transistor, the fifth transistor, the sixth transistor, the first bias circuit, and the third bias circuit have a respective plurality of design attributes, and wherein at least one of the respective plurality of design attributes is established to achieve a gain equal to a first target gain of one, the gain being defined by an output amplitude of a first output signal at the first connection node divided by an input amplitude of the first input signal.

15. The device of claim 11, wherein at least one of the first transistor, the second transistor, the sixth transistor, the first bias circuit, and the third bias circuit comprise an N-type MOSFET device, and wherein the fifth transistor comprises a P-type MOSFET device.

* * * * *